(12) United States Patent
Hsu

(10) Patent No.: US 7,365,418 B2
(45) Date of Patent: Apr. 29, 2008

(54) MULTI-CHIP STRUCTURE

(75) Inventor: Chi-Hsing Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 11/534,574

(22) Filed: Sep. 22, 2006

(65) Prior Publication Data

US 2008/0036062 A1 Feb. 14, 2008

(30) Foreign Application Priority Data

Aug. 8, 2006 (TW) ............... 95129027 A

(51) Int. Cl.
*H01L 23/02* (2006.01)

(52) U.S. Cl. ............ 257/686; 257/717; 257/777; 257/E25.013

(58) Field of Classification Search ........ 257/686, 257/688, 689, 717, 777, 778, E23.02, E23.085, 257/E25.013
See application file for complete search history.

(56) References Cited

U.S. PATENT DOCUMENTS

| 6,777,804 B1 | 8/2004 | Hsu | 257/725 |
| 6,879,031 B2 * | 4/2005 | Wang | 257/686 |
| 7,157,787 B2 * | 1/2007 | Kim et al. | 257/621 |
| 7,229,851 B2 * | 6/2007 | Hubner | 438/109 |
| 7,291,924 B2 * | 11/2007 | Wang et al. | 257/777 |
| 2004/0051170 A1 | 3/2004 | Kawakami et al. | 257/686 |
| 2004/0173898 A1 | 9/2004 | Ito et al. | |
| 2004/0217485 A1 * | 11/2004 | Chung | 257/778 |
| 2006/0060963 A1 | 3/2006 | Chang | |
| 2006/0226527 A1 * | 10/2006 | Hatano et al. | 257/686 |

FOREIGN PATENT DOCUMENTS

| CN | 1495893 | 5/2004 |
| CN | 2629217 | 7/2004 |

* cited by examiner

*Primary Examiner*—T. N. Quach
(74) *Attorney, Agent, or Firm*—J.C. Patents

(57) ABSTRACT

A multi-chip structure at least including a first chip, a second chip and a first thermal-conductive layer is provided. The first chip has a first surface and a plurality of first pads disposed on the first surface. The second chip has a second surface facing the first surface and a plurality of second pads disposed on the second surface. The first thermal-conductive layer is disposed between the first chip and the second chip and includes a thermal-conductive area, a plurality of first electrical connection members and a plurality of first dielectric areas. The first electrical connection members disposed in the first thermal-conductive layer are used to electrically connect the first surface and the second surface. The first dielectric areas surround and insulate the first electrical connection members from the thermal-conductive area.

20 Claims, 6 Drawing Sheets

MULTI-CHIP STRUCTURE

CROSS-REFERENCE TO RELATED APPLICATION

This application claims the priority benefit of Taiwan application serial no. 95129027, filed on Aug. 8, 2006. All disclosure of the Taiwan application is incorporated herein by reference.

BACKGROUND OF THE INVENTION

1. Field of the Invention

The present invention relates to a multi-chip structure, and more particularly, to a multi-chip structure with improved heat dissipation capacity.

2. Description of Related Art

As electronic technologies continue to evolve and develop, the trend of integrated circuit (IC) development is to move toward higher level integration, higher device density and smaller volume so that lighter and more compact electronic products are produced. In the semiconductor packaging technologies, developing a high density package structure is always the goal. One example is the development of multi-chip package structure. Accordingly, how to increase the heat dissipation efficiency of a high-density package structure has gradually become one of the major concerns.

FIG. 1 is a perspective view of a conventional package structure. The conventional package structure 100 has been disclosed in U.S. Patent Application No. 2004/0173898. The package structure 100 includes a chip 110, a substrate 120, a plurality of bonding wires 130 and a metal sheet 140. The chip 110 is electrically connected to the substrate 120 through the bonding wires 130 and the metal sheet 140 is disposed between the chip 110 and the substrate 120. When the chip 110 operates and produces heat, the metal sheet 140 transfers the heat to the surrounding. However, the package structure 100 is rather bulky because the metal sheet 140 is disposed between the chip 110 and the substrate 120.

FIG. 2 is a side view of another conventional package structure. The conventional package structure 200 has been disclosed in U.S. Patent Application No. 2006/0060963. The package structure 200 is a multi-chip package structure having two chips 210, two substrates 220, a plurality of bumps 230, a heat spreader 240 and a plurality of stiffening members 250. The heat spreader 240 is disposed between the back surfaces 212 of the two chips 210 and the active surface 214 of each chip 210 faces one of the substrates 220. The chips 210 are electrically connected to their corresponding substrates 220 through the bumps 230. The stiffening members 250 are used for fixing the substrates 220 relative to each other. However, the package structure 200 is rather bulky because the heat spreader 240 is disposed between the back surfaces 212 of the two chips 210.

FIG. 3 is a side view of yet another conventional package structure. The conventional package structure 300 is a multi-chip package structure having two chips 310, a plurality of bumps 320 and an underfill layer 330. The chips 310 are electrically connected to each other through the bumps 320. However, the underfill layer 320 has low thermal conductivity. Hence, the temperature in the area between the chips 310 may rise too high when the chips 310 inside the package structure 300 operate.

SUMMARY OF THE INVENTION

The present invention provides a multi-chip structure. The multi-chip structure includes a first chip, a second chip, a plurality of first signal bumps, a plurality of non-signal bumps, a first thermal-conductive layer and a plurality of first dielectric areas. The first chip has a first surface, a plurality of first signal pads and a plurality of first non-signal pads. The first signal pads and the first non-signal pads are disposed on the first surface. The second chip has a second surface, a plurality of second signal pads and a plurality of second non-signal pads. The second signal pads and the second non-signal pads are disposed on the second surface. The second surface faces the first surface. Furthermore, at least a portion of the first signal pads are electrically connected to their corresponding second signal pads through the first signal bumps, and at least a portion of the first non-signal pads are electrically connected to their corresponding second non-signal pads through the first non-signal bumps. In addition, the first thermal-conductive layer surrounds the first signal bumps and is disposed between the first surface and the second surface. The first dielectric areas surround the first signal bumps. Moreover, the first signal bumps are electrically insulated from the first thermal-conductive layer by the first dielectric areas.

The present invention also provides an alternative multi-chip structure. The multi-chip structure at least includes a first chip, a second chip and a first thermal-conductive layer. The first chip has a first surface and a plurality of first pads. The first pads are disposed on the first surface. The second chip has a second surface and a plurality of second pads disposed on the second surface. The second surface faces the first surface. The first thermal-conductive layer is disposed between the first chip and the second chip. The first thermal-conductive layer has a thermal-conductive area, a plurality of first electrical connection members and a plurality of first dielectric areas. The first electrical connection members are disposed in the first thermal-conductive layer for electrically connecting the first surface to the second surface. The first dielectric areas surround the first electrical connection members. Moreover, the first electrical connection members are electrically insulated from the thermal-conductive area by the first dielectric areas.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
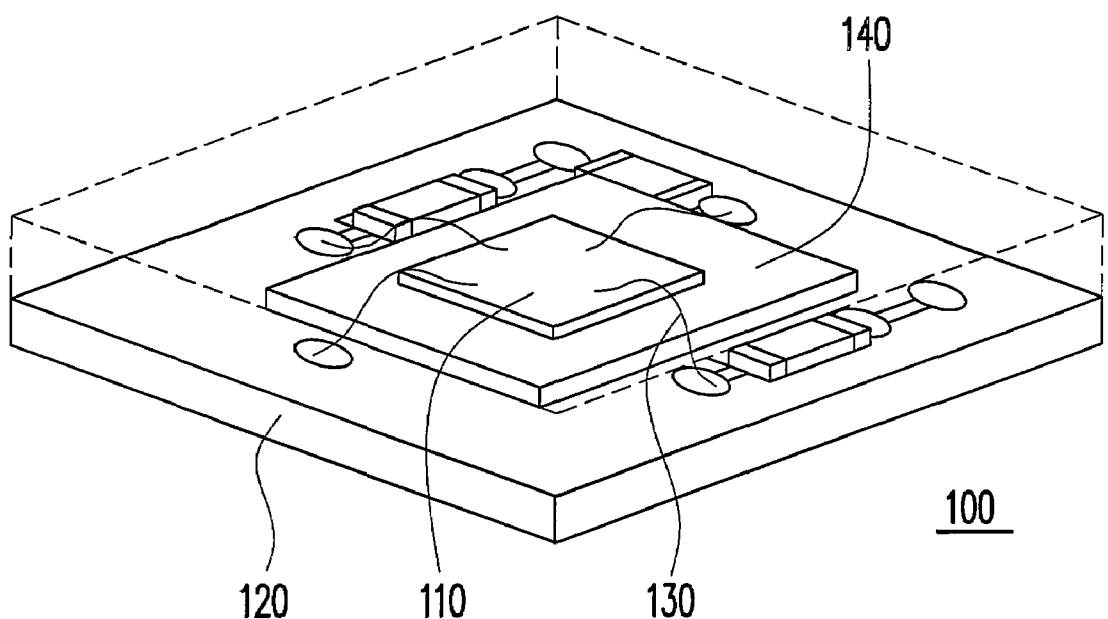
FIG. 1 is a perspective view of a conventional package structure.
Figure 2:
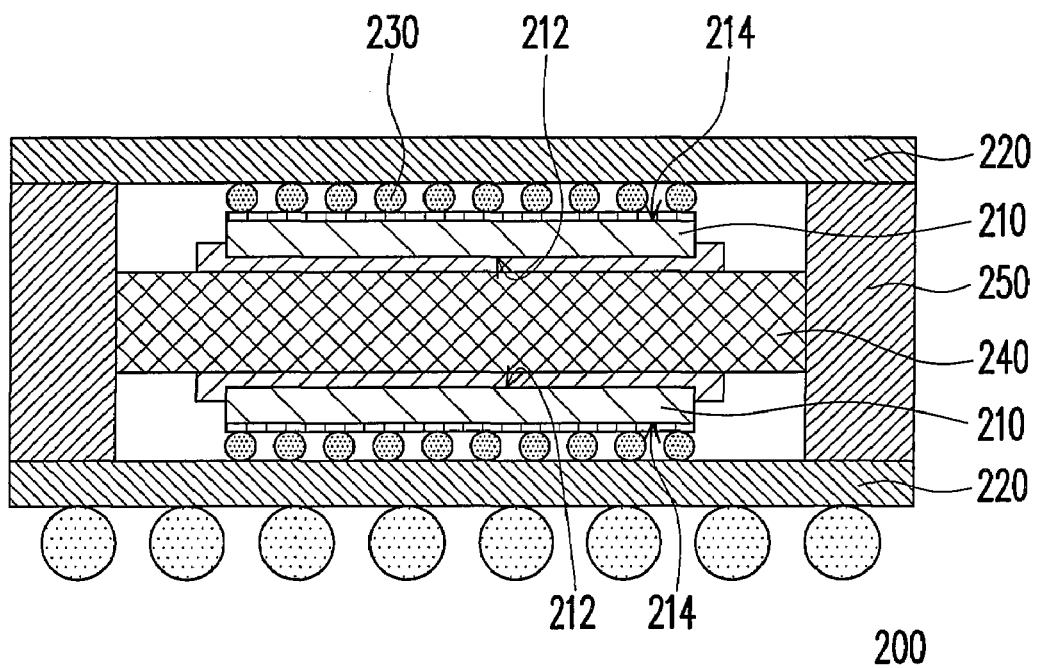
FIG. 2 is a side view of another conventional package structure.
Figure 3:
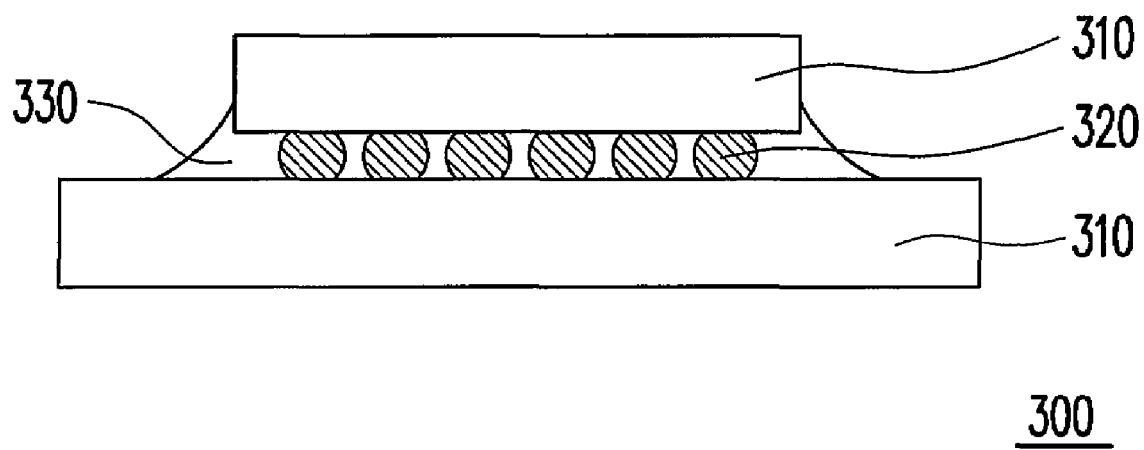
FIG. 3 is a side view of yet another conventional package structure.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 4A:
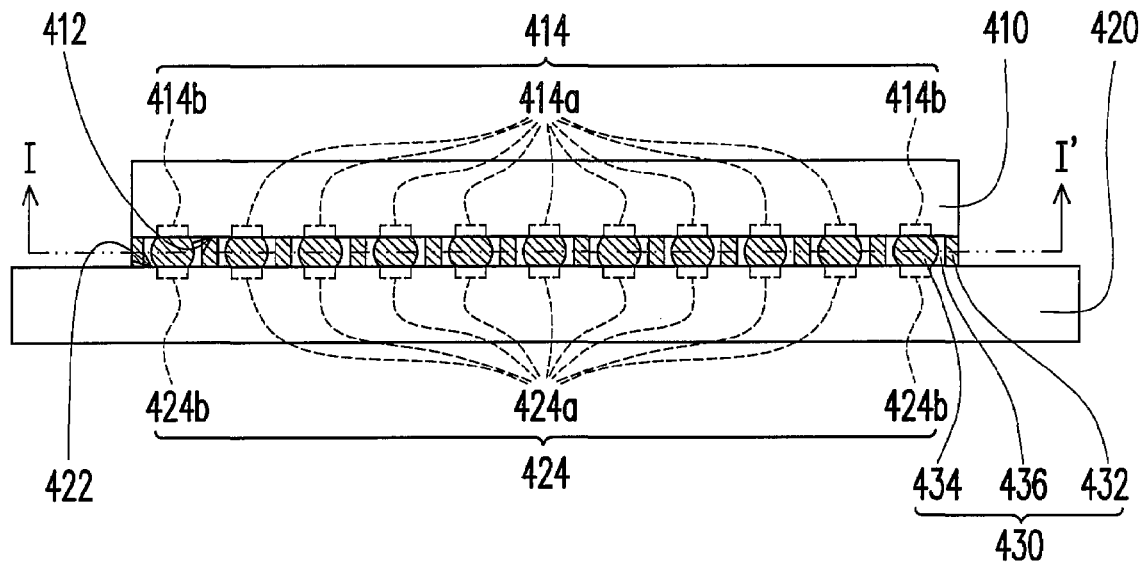
FIG. 4A is a side view of a multi-chip structure according to a first embodiment of the present invention.
Figure 4B:
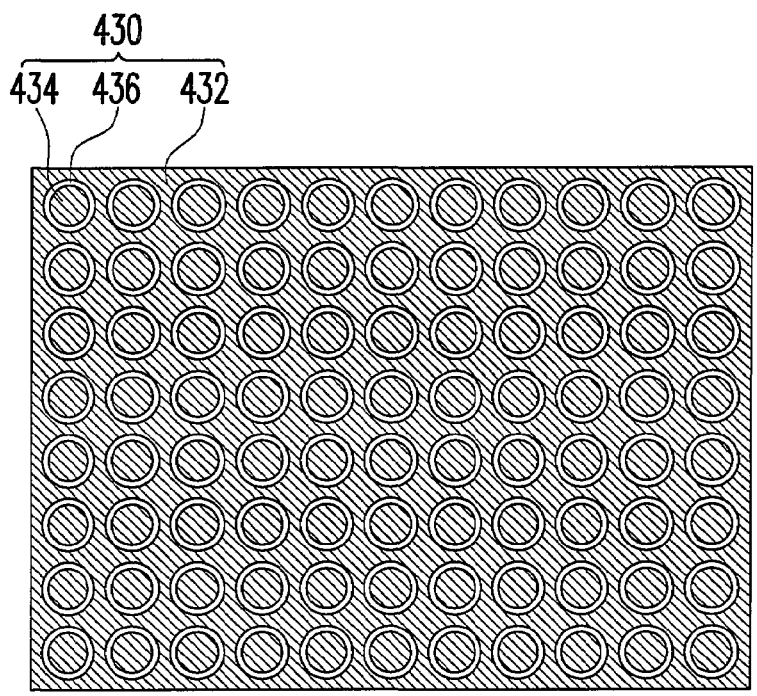
FIG. 4B is a cross-sectional view along the line I-I' of the multi-chip structure shown in FIG. 4A.

FIG. 4A is a side view of a multi-chip structure according to a first embodiment of the present invention. FIG. 4B is a cross-sectional view along the line I-I' of the multi-chip structure shown in FIG. 4A.

As shown in FIGS. 4A and 4B, the multi-chip structure 400 in the first embodiment includes a chip 410, a chip 420, and a thermal-conductive layer 430. The chip 410 has a surface 412 and a plurality of pads 414. The pads 414 are disposed on the surface 412. The chip 420 has a surface 422 and a plurality of pads 424. The pads 424 are disposed on the surface 422. The surface 412 faces the surface 422. The thermal-conductive layer 430 is disposed between the chip 410 and the chip 420. The thermal-conductive layer 430 has a thermal-conductive area 432, a plurality of electrical connection members 434, and a plurality of dielectric areas 436. The electrical connection members 434 are disposed in the thermal-conductive layer 430 and used for electrically connecting the surface 412 to the surface 422. The dielectric areas 436 surround the electrical connection members 434. Moreover, the electrical connection members 434 are electrically insulated from the thermal-conductive area 432 by the dielectric areas 436.

Because the thermal-conductive area 432 of the thermal-conductive layer 430 has good thermal conductivity, thermal energy can be transferred to the surrounding by the thermal-conductive area 432 when the chip 410 and the chip 420 inside the multi-chip structure 400 are operated and produce heat. Therefore, the temperature of the operating multi-chip structure 400 is not very high and is able to maintain within a prescribed operating temperature range.

In the present embodiment, the chip 410 and the chip 420 may be connected together through a thermal compression or an ultrasonic bonding process. In addition, the pads 414 of the chip 410 include a plurality of signal pads 414a and a plurality of non-signal pads 414b. The pads 424 of the chip 420 include a plurality of signal pads 424a and a plurality of non-signal pads 424b. Moreover, the signal pads 414a are electrically connected to their corresponding signal pads 424a through a portion of the electrical connection members 434. The non-signal pads 414b are electrically connected to their corresponding non-signal pads 424b through the remaining portion of the electrical connection members 434. Furthermore, in another embodiment, the pads 414 of the chip 410 and the pads 424 of the chip 420 may be signal pads, and the pads 414 may be electrically connected to their corresponding pads 424 through the electrical connection members 434.

In the present embodiment, the electrical connection members 434 can be bumps fabricated from a metallic material. The thermal-conductive area 432 is fabricated from a metal, for example, gold, lead-tin alloy, or palladium. The dielectric areas 436 can be fabricated from a dielectric material including a high molecular weight material, a composite material, a resin material, or a thermoplastic material. The high molecular weight material includes, for example, unsaturated polyester, polyester, polyimide, polytetrafluoetylene (PTFE), or perfluorinated ethylene-propylene copolymer (FEP). The composite material includes, for example, cyanate ester glass, polyimide glass, or Ajinomoto Build-up Film (ABF).

The resin material includes, for example, synthetic resin, thermosetting resin, thermoplastic resin, or photosensitive resin. More specifically, the resin material includes, for example, epoxy resin, phenolic resin, polyester resin, polyimide resin, bismaleimide-triazine resin, acrylic resin, melamine formaldehyde resin, polyfunctional epoxy resin, brominated epoxy resin, epoxy novolac, fluroresin, silicone resin, or silane.

Thermoplastic material is a substance whose viscoelasticity or fluidity increases with temperature increasing. This type of material may be high molecular weight material, composite material, or other thermoplastic material.

Second Embodiment

Figure 5A:
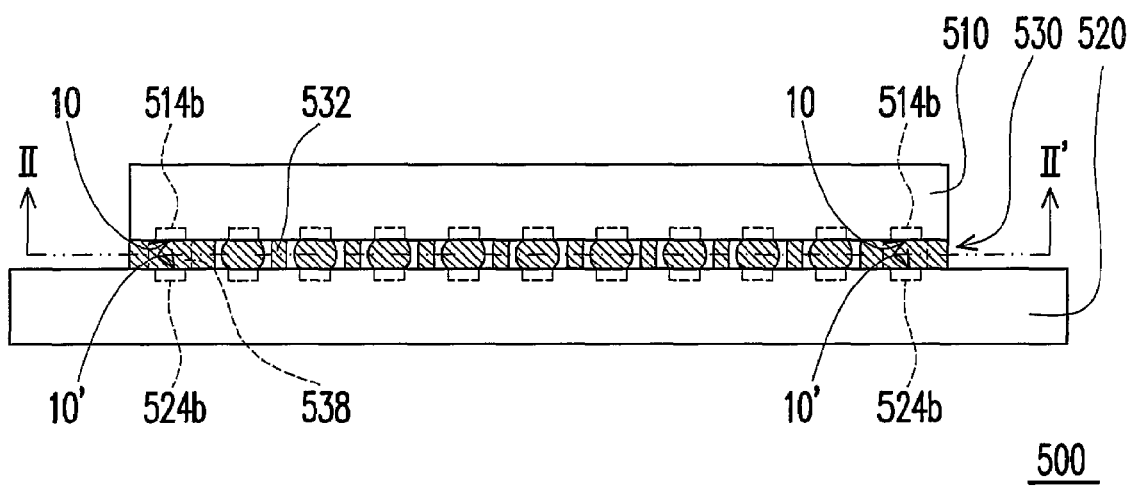
FIG. 5A is a side view of a multi-chip structure according to a second embodiment of the present invention.
Figure 5B:
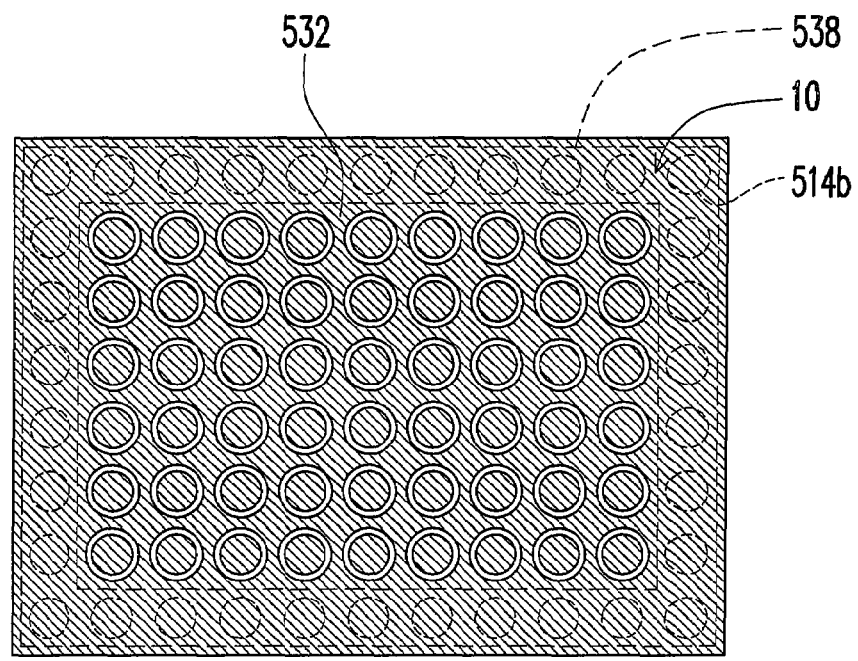
FIG. 5B is a cross-sectional view along the line II-II' of the multi-chip structure shown in FIG. 5A.

FIG. 5A is a side view of a multi-chip structure according to a second embodiment of the present invention. FIG. 5B is a cross-sectional view along the line II-II' of the multi-chip structure shown in FIG. 5A.

As shown in FIGS. 5A and 5B, the main difference between the multi-chip structure 500 in the second embodiment and the multi-chip structure 400 in the first embodiment is that the first thermal-conductive layer 530 in the multi-chip structure 500 further includes an electrical connection area 538.

Because of the internal wiring design of the chip 510 and the chip 520, a portion of the non-signal pads 514b of the first chip 510 gathers in an area 10 and a portion of the non-signal pads 524b of the chip 520 gathers in another area 10'. Furthermore, the area 10 and the area 10' correspond in position to each other.

In addition, the non-signal pads 514b inside the area 10 and the non-signal pads 524b inside the area 10' can be the same type. For example, both are ground pads or both are power pads. Therefore, the non-signal pads 514b in the area 10 and the non-signal pads 524b in the area 10' are electrically connected through the electrical connection area 538.

It should be noted that the thermal-conductive area 532 and the electrical connection area 538 may be simply connected together without using an dielectric area 536 as an insulation layer. More specifically, from the point of view of the fabrication process, the thermal-conductive area 532 and the electrical connection area 538 may be the same material and be fabricated in the same processing step.

Third Embodiment

Figure 6A:
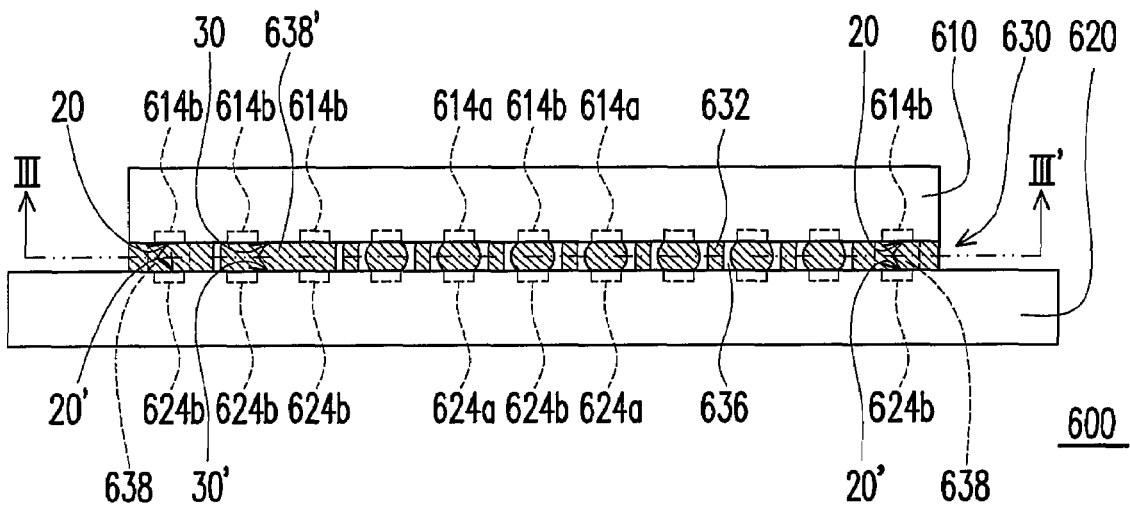
FIG. 6A is a side view of a multi-chip structure according to a third embodiment of the present invention.
Figure 6B:
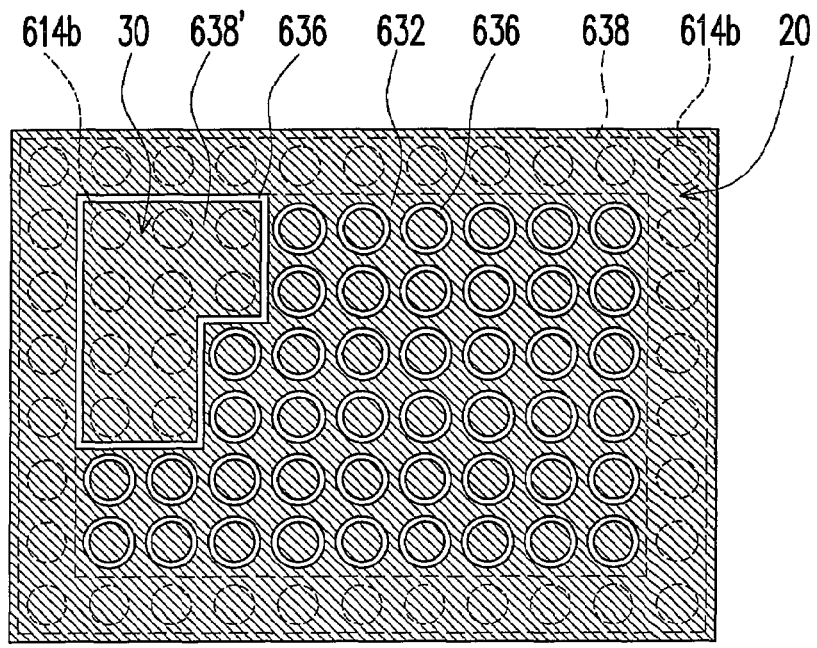
FIG. 6B is a cross-sectional view along the line III-III' of the multi-chip structure shown in FIG. 6A.

FIG. 6A is a side view of a multi-chip structure according to a third embodiment of the present invention. FIG. 6B is a cross-sectional view along the line III-III' of the multi-chip structure shown in FIG. 6A.

As shown in FIGS. 6A and 6B, the main difference between the multi-chip structure 600 in the third embodiment and the multi-chip structures 400 and 500 is that the thermal-conductive layer 630 of the multi-chip structure 600 further includes two electrical connection areas 638 and 638'.

Because of the internal wiring design of the chip 610 and the chip 620, some portion of the non-signal pads 614b of the chip 610 gathers in an area 20, some portion gathers in another area 30, and another portion is dispersed between the signal pads 614a. In addition, a portion of the non-signal pads 624b of the chip 620 gathers in an area 20', some portion gathers in another area 30', and another portion is dispersed between the signal pads 624a.

Because the non-signal pads 614b inside the area 20 and the non-signal pads 624b in the area 20' may be power pads and because the area 20 and the area 20' correspond in position to each other, the non-signal pads 614b in the area 20 and the non-signal pads 624b in the area 20' may be electrically connected through the electrical connection area 638. Similarly, because the non-signal pads 614b inside the area 30 and the non-signal pads 624b in the area 30' may be ground pads and because the area 30 and the area 30' correspond in position to each other, the non-signal pads 614b in the area 30 and the non-signal pads 624b in the area 30' may be electrically connected through the electrical connection area 638'.

It should be noted that the thermal-conductive area 632 and one of the electrical connection areas 638, 638' are simply connected together without using an dielectric area 636 as an insulation layer. In the present embodiment, the thermal-conductive area 632 and the electrical connection area 638 are connected together. In other words, the electrical connection area 638 has to be electrically insulated from the electrical connection area 638' so that the transmission path of ground signal and the transmission path of the power signal will not be like a short circuit. From the point of view of fabrication process, the thermal-conductive area 632 and the electrical connection area 638 or the electrical connection area 638' may be fabricated from the same material; or all three are fabricated from the same material; or all three are fabricated from different materials. In addition, the thermal-conductive area 632, the electrical connection area 638 and the electrical connection area 638' may be fabricated in the same processing step.

Fourth Embodiment

Figure 7A:
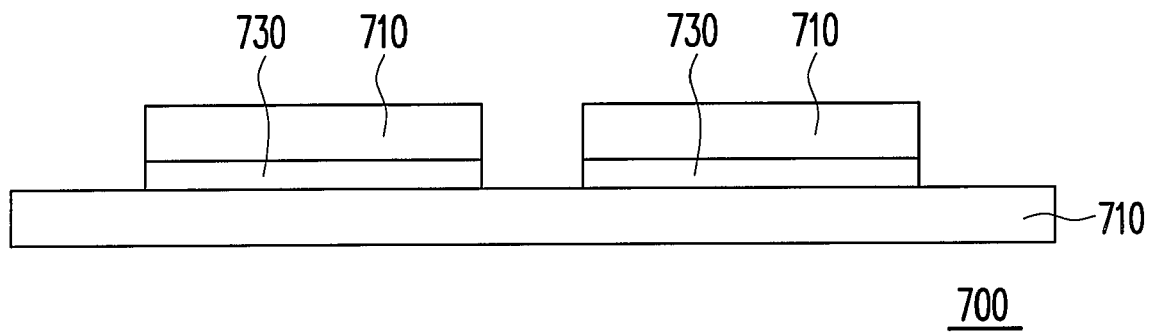
FIG. 7A is a side view of a multi-chip structure according to a fourth embodiment of the present invention.
Figure 7B:
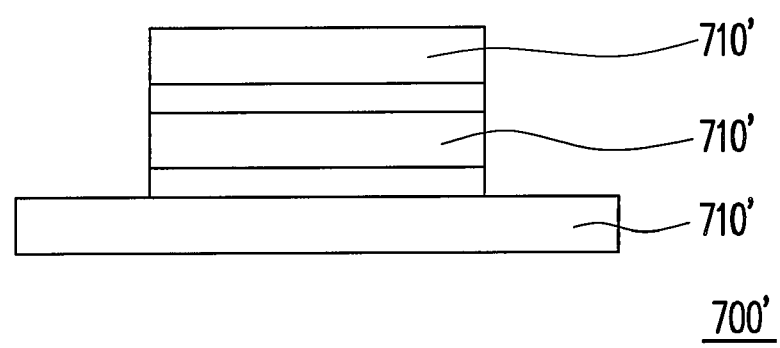
FIG. 7B is a side view of another multi-chip structure according to the fourth embodiment of the present invention.

FIG. 7A is a side view of a multi-chip structure according to a fourth embodiment of the present invention. The multi-chip structure 700 in the present embodiment includes three stacked chips 710. A thermal-conductive layer 730 is disposed between neighboring chips 710. The location and connecting method of the thermal-conductive layer 730 may be the same as that of the thermal-conductive layer of one of the three foregoing embodiments. Hence, a detailed description is omitted. FIG. 7B is a side view of another multi-chip structure according to the fourth embodiment of the present invention. The chips 710' in the multi-chip structure 700' are stacked in a different way compared to the chips 710 in the multi-chip structure 700.

In summary, the multi-chip structure in the present invention has at least the following advantages:

1. Because the multi-chip structure in the present invention has a thermal-conductive area, the multi-chip structure has a higher heat dissipation capacity.

2. Because the thermal-conductive area is located between the chips, the multi-chip structure occupies a smaller volume.

3. Because the thermal-conductive area and the electrical connection area in the multi-chip structure can be fabricated in the same processing step, the production cycle of the multi-chip structure of the present invention is shortened.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-chip structure, comprising:
   a first chip having a first surface, a plurality of first signal pads and a plurality of first non-signal pads, wherein the first signal pads and the first non-signal pads are disposed on the first surface;
   a second chip having a second surface, a plurality of second signal pads and a plurality of second non-signal pads, wherein the second signal pads and the second non-signal pads are disposed on the second surface, and the second surface faces the first surface;
   a plurality of first signal bumps, wherein at least a portion of the first signal pads are electrically connected to their corresponding second signal pads through the first signal bumps;
   a plurality of first non-signal bumps, wherein at least a portion of the first non-signal pads are electrically connected to their corresponding second non-signal pads through the first non-signal bumps;
   a first thermal-conductive layer surrounding the first signal bumps and disposed between the first surface and the second surface; and
   a plurality of first dielectric areas surrounding the first signal bumps, wherein the first signal bumps are electrically insulated from the first thermal-conductive layer by the first dielectric areas.

2. The multi-chip structure of claim 1, wherein a material constituting the bumps comprises a metal.

3. The multi-chip structure of claim 1, wherein a material constituting the first thermal-conductive layer comprises a metal.

4. The multi-chip structure of claim 1, wherein the pads comprise power pads, ground pads, or a combination thereof.

5. The multi-chip structure of claim 1, wherein the first dielectric areas surround the first non-signal bumps, and the first non-signal bumps are electrically insulated from the first thermal-conductive layer by the first dielectric areas.

6. The multi-chip structure of claim 1, further comprising:
   a third chip having a third surface, a plurality of third signal pads and a plurality of third non-signal pads, wherein the third signal pads and the third non-signal pads are disposed on the third surface, and the third surface faces the first surface;
   a plurality second signal bumps, wherein at least a portion of the first signal pads are electrically connected to their corresponding third signal pads through the second signal bumps;
   a plurality second non-signal bumps, wherein at least a portion of the first non-signal pads are electrically connected to their corresponding third non-signal pads through the second non-signal bumps;

a second thermal-conductive layer surrounding the second signal bumps and disposed between the first surface and the third surface; and a plurality of second dielectric areas, wherein the second dielectric areas surround the second signal bumps, and the second signal bumps are electrically insulated from the second thermal-conductive layer by the second dielectric areas.

7. The multi-chip structure of claim 6, wherein the second dielectric areas surround the second non-signal bumps, and the second non-signal bumps are electrically insulated from the second thermal-conductive layer by the second dielectric areas.

8. The multi-chip structure of claim 1, wherein the second chip further comprises a third surface, a plurality of third signal pads and a plurality of third non-signal pads, wherein the third signal pads and the third non-signal pads are disposed on the third surface.

9. The multi-chip structure of claim 8, further comprising:

a third chip having a fourth surface, a plurality of fourth signal pads and a plurality of fourth non-signal pads, wherein the fourth signal pads and the fourth non-signal pads are disposed on the fourth surface, and the fourth surface faces the third surface;

a plurality of second signal bumps, wherein at least a portion of the third signal pads are electrically connected to their corresponding fourth signal pads through the second signal bumps;

a plurality of second non-signal bumps, wherein at least a portion of the third non-signal pads are electrically connected to their corresponding fourth non-signal pads through the second non-signal bumps;

a second thermal-conductive layer surrounding the second signal bumps and disposed between the third surface and the fourth surface; and a plurality of second dielectric areas, wherein the second dielectric areas surround the second signal bumps, and the second signal bumps are electrically insulated from the second thermal-conductive layer by the second dielectric areas.

10. The multi-chip structure of claim 9, wherein the second dielectric areas surround the second non-signal bumps, and the second non-signal bumps are electrically insulated from the second thermal-conductive layer by the second dielectric areas.

11. A multi-chip structure, at least comprising:

a first chip having a first surface and a plurality of first pads, wherein the first pads are disposed on the first surface;

a second chip having a second surface and a plurality of second pads, wherein the second pads are disposed on the second surface, and the second surface faces the first surface; and a first thermal-conductive layer, disposed between the first chip and the second chip, wherein the first thermal-conductive layer comprises:

a thermal-conductive area;

a plurality of first electrical connection members, wherein the first electrical connection members are disposed in the first thermal-conductive layer for electrically connecting the first surface to the second surface; and a plurality of first dielectric areas surrounding the first electrical connection members, wherein the first electrical connection members are electrically insulated from the thermal-conductive area by the first dielectric areas.

12. The multi-chip structure of claim 11, wherein the first pads comprise a plurality of first signal pads, and the second pads comprise a plurality of second signal pads, wherein the first signal pads are electrically connected to their corresponding second signal pads through the first electrical connection members.

13. The multi-chip structure of claim 11, wherein the first pads comprise a plurality of first non-signal pads, and the second pads comprise a plurality of second non-signal pads, wherein the first non-signal pads are electrically connected to their corresponding second non-signal pads through the first electrical connection members.

14. The multi-chip structure of claim 11, wherein the first thermal-conductive layer further comprises a plurality of second electrical connection members, the first pads comprise a plurality of first non-signal pads, and the second pads comprise a plurality of second non-signal pads, wherein the first non-signal pads are electrically connected to their corresponding second non-signal pads through the second electrical connection members.

15. The multi-chip structure of claim 14, wherein the second electrical connection members are electrically insulated form the thermal-conductive area by the first dielectric areas.

16. The multi-chip structure of claim 14, wherein a material constituting the second electrical connection members comprises a metal.

17. The multi-chip structure of claim 11, wherein the first thermal-conductive layer further comprises at least one first electrical connection area, the first pads comprise a plurality of first non-signal pads, and the second pads comprise a plurality of second non-signal pads, wherein the first non-signal pads are electrically connected to their corresponding second non-signal pads through the first electrical connection area.

18. The multi-chip structure of claim 17, wherein the first electrical connection area is electrically insulated from the thermal-conductive area by at least one of the first dielectric areas.

19. The multi-chip structure of claim 11, wherein a material constituting the thermal-conductive area comprises a metal.

20. The multi-chip structure of claim 11, wherein a material constituting the first electrical connection members comprises a metal.

* * * * *